United States Patent [19]

Blanchard

[11] Patent Number: 4,710,234

[45] Date of Patent: Dec. 1, 1987

[54] PROCESS FOR MANUFACTURING AN ANTI-BLOOMING DIODE ASSOCIATED WITH A SURFACE CANAL

[75] Inventor: Pierre Blanchard, Verrieres le Buisson, France

[73] Assignee: Thomson—CSF, Paris, France

[21] Appl. No.: 833,733

[22] Filed: Feb. 25, 1986

[30] Foreign Application Priority Data

Mar. 8, 1985 [FR] France ................................. 85 03447

[51] Int. Cl.$^4$ ..................... H01L 21/265; G11C 19/28
[52] U.S. Cl. ......................................... 437/40; 357/24; 357/91; 437/51
[58] Field of Search ................... 148/1.5, 187; 29/571, 29/576 B; 357/24, 91

[56] References Cited

U.S. PATENT DOCUMENTS

| | | | |
|---|---|---|---|
| 3,853,634 | 12/1974 | Amelio et al. | 148/1.5 |
| 3,896,474 | 7/1975 | Amelio et al. | 357/24 |
| 4,076,557 | 2/1978 | Huang et al. | 148/1.5 |
| 4,173,064 | 11/1979 | Farnow | 29/578 |
| 4,179,793 | 12/1979 | Hagiwara | 29/578 |
| 4,216,574 | 8/1980 | Feist | 29/578 |
| 4,360,963 | 11/1982 | Jastrzebski | 29/571 |
| 4,362,575 | 12/1982 | Wallace | 148/1.5 |
| 4,396,438 | 8/1983 | Goodman | 148/1.5 |
| 4,607,429 | 8/1986 | Kosonocky | 29/576 B |

FOREIGN PATENT DOCUMENTS

| | | |
|---|---|---|
| 2199200 | 4/1974 | France . |
| 56-58282 | 5/1981 | Japan . |
| 57-190353 | 11/1982 | Japan . |

OTHER PUBLICATIONS

IEEE Transactions on Electron Devices, vol. ED-21, No. 6, Jun. 1974, pp. 331–341, C. H. Sequin et al.: "Measurements on a Charge-Coupled Area Image Sensor with Blooming Suppression".

*Primary Examiner*—Upendra Roy
*Attorney, Agent, or Firm*—Roland Plottel

[57] ABSTRACT

A process for forming an anti-glare diode associated with a surface canal which consists in depositing a first layer of a dielectric material on a silicon substrate then depositing on this first layer a second polycrystalline silicon layer, etching by a photolithographic process the second silicon layer so as to bare the dielectric layer in two zones, a first zone defining the space for formation of the diode, a second zone defining a volume canal zone, a third zone defining the surface canal being protected by the remaining silicon, implanting impurities in the volume transfer canal zone and masking the volume transfer canal zone while leaving the zone reserved for the diode uncovered so as to bare the substrate in the zone reserved for the diode and depositing a second polycrystalline silicon layer on the whole formed by the bared part of the substrate, the second silicon layer and the dielectric and etching the second or both silicon layers so as to form the gate.

2 Claims, 10 Drawing Figures

PROCESS FOR MANUFACTURING AN ANTI-BLOOMING DIODE ASSOCIATED WITH A SURFACE CANAL

BACKGROUND OF THE INVENTION

The present invention relates to a process for manufacturing an anti-blooming diode associated with a surface canal and an anti-blooming system obtained by this process applicable more particularly to the formation of frame transfer matrices and more generally to the formation of opto-electronic components.

Anti-blooming diodes are generally formed on the semiconductor substrates of frame transfer matrices using photolithographic processes comprising several photolithographic operations. During these operations inverse impurities are implanted in the substrate for creating under the gates potential wells greater than those of the non implanted parts, the non implanted zones generally bearing the name of surface canal zones and the implanted zones bearing the name of volume canal zones. In this process, each diode is connected to a gate while being isolated from the corresponding volume transfer canal zone by a potential barrier obtained from a surface canal zone which forms an MOS transistor structure, MOS being the abbreviation for "metal oxide semiconductor", whose source is formed by a conventional diode and whose drain is formed by a weakly doped diode whose surface canal is controlled by the gate.

This process has the disadvantage of being poorly adapted to large scale production of frame transfer matrices for the accuracy of positioning the surface canal zones and the volume canal zones depends in this process entirely on that of the photolithographic machines, which does not allow good reproducibility of the frame transfer matrices obtained.

SUMMARY OF THE INVENTION

The aim of the invention is to overcome the above mentioned drawbacks.

To this end, the invention has as object a process for manufacturing an anti-blooming diode associated with a surface canal, which consists in depositing a first layer of a dielectric material on a silicon substrate, then in depositing a second undoped polycrystalline silicon layer on this first layer, etching said second silicon layer by photolithography so as to bare the dielectric layer in two zones, a first zone defining the space for formation of the diode, a second zone defining a volume canal zone, a third zone defining the surface canal being protected by the remaining silicon, implanting impurities in the volume transfer canal zone and masking the volume canal zone while leaving uncovered the zone reserved for the diode so as to bare the substrate in this latter zone and depositing a second polycrystalline silicon layer on the whole formed by the bared part of the substrate, the second silicon layer and the dielectric and etching the or both layers for forming the gate.

The invention also provides an anti-blooming system obtained by this process applicable more particularly to the formation of a frame transfer matrix.

The principle advantage of the process of the invention is that the distance from the diode to the volume transfer canal as well as the area thereof can be defined by a single photolithographic etching operation, so that reproducibility of the surface canal and of the diode may be ensured. With this solution, the minimum dimensions may also be chosen which should be given not only to the diode area but also to the canal width for forming the frame transfer matrices.

BRIEF DESCRIPTION OF THE DRAWINGS

Other features and advantages of the invention will be clear from the following description made with reference to the accompanying drawings which are given solely by way of example and in which.

DETAILED DESCRIPTION OF THE INVENTION

Figure 1:
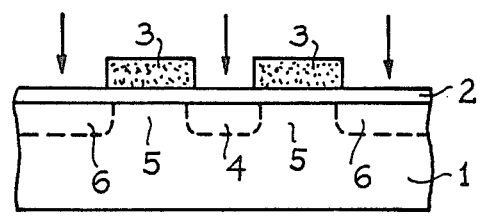
FIGS. 1 to 5 show the different phases of the process of the invention.
Figure 2:
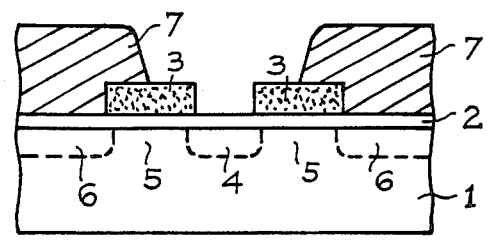
Figure 3:
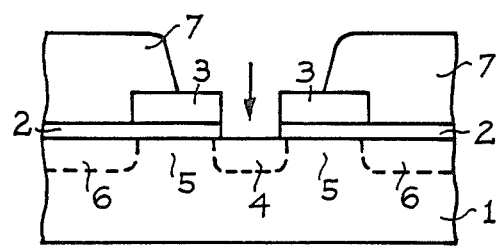
Figure 4:
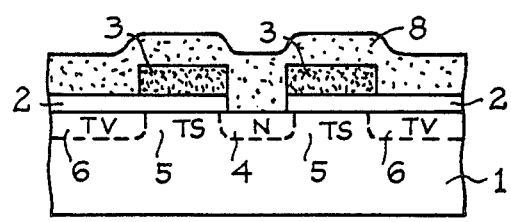
Figure 5:
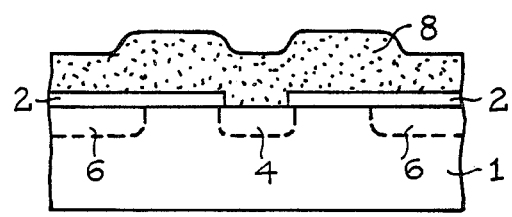

The first step of the process of the invention which is shown in FIG. 1 consists in depositing a layer of a dielectric material 2 on the upper surface of a substrate 1, then in depositing an undoped polycrystalline silicon layer 3 on the dielectric layer 2 thus formed. By photolithographic etching of the polycrystalline silicon layer 3, zones 4, 5, 6 are formed defining respectively the space reserved for the diode, the surface transfer canal zone and the volume transfer canal zone and zones 4 and 6 implanted with impurities. In the step shown in FIG. 2, masking of the volume transfer canal zones is provided by a mask 7 which leaves zone 4 reserved for the diode uncovered. In the step shown in FIG. 3, the substrate is bared in the space reserved for the diode 4 then, in the step shown in FIG. 4, a second polycrystalline silicon layer 8 is deposited on the assembly formed by the first silicon layers and the dielectric or substrate and the two silicon layers 3 and 8 are doped simultaneously, which results in doping the substrate in zone 4 and the silicon layer 8 thus formed. In the step shown in FIG. 5, a third photolithograpic etching is carried out for defining the gates.

Figure 6A:
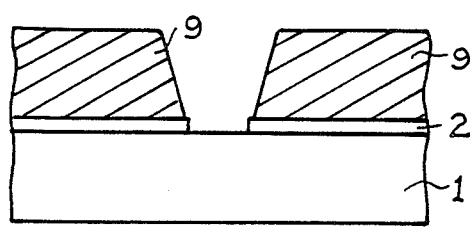
FIGS. 6a to 6c illustrate a process of the prior art for forming an anti-glare diode.
Figure 6B:
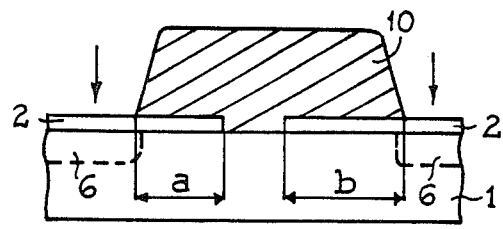
Figure 6C:
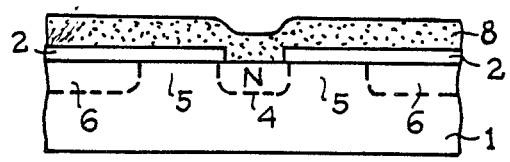

Contrary to known processes, with the process of the invention the distance from the diode to the volume transfer canal as well as the area of the diode can be defined in a single photolithographic etching, in fact, in the prior art process which is shown in FIGS. 6a, 6b and 6c the zone reserved for the diode and the volume canal zone 6 are obtained first of all, as shown in FIG. 6a, by a photolithographic etching using a mask 9 applied to the surface of the dielectric layer 2 for defining the zone reserved for the diode, then in the step shown in FIG. 6b a photolithographic operation is performed for implanting zone 6 thus defining the volume canal zone, the surface canal zone being protected by the resin of mask 10 and finally a third photolithographic etching is performed shown in FIG. 6c for forming the gate with the silicon deposited above the zone reserved for the diode and the dielectric layer 2. In this process, the surface transfer canal lengths separating the zone reserved for the diode 4 from the volume canal zone 6 depend entirely on the precision of mask 10 serving for the second photolithographic operation shown in FIG. 6b. With the process of the invention, the precision of the surface canal zones is obtained directly by the first photolithographic etching shown in FIG. 1 so that reproducibility of the surface canal betwen diode 4 and the volume canal zone 6 is always ensured.

Figure 7:
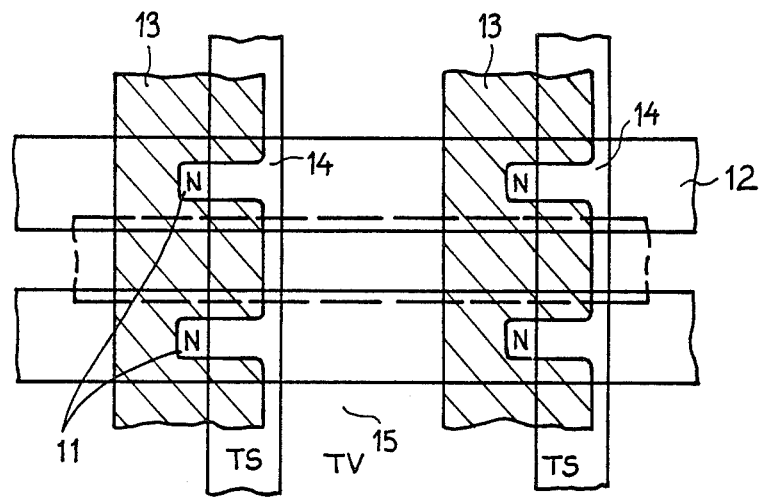
FIG. 7 is a representation of a prior art construction of an anti-glare system of a frame transfer matrix.
Figure 8:
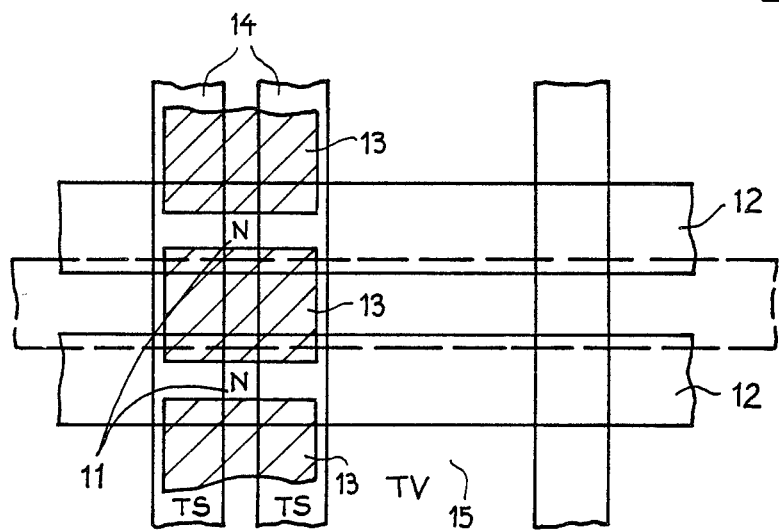
FIG. 8 is a representation of an anti-glare system of a frame transfer matrix obtained in accordance with the process of the invention.

One example of application of the process of the invention to the formation of frame transfer matrices using an anti-blooming system is described hereafter with reference to FIGS. 7 and 8. In the anti-blooming systems of the prior art frame transfer matrices of the type shown in FIG. 7, each diode 11 is formed from the gate 12 which forms a part of the pixel of the charge transfer matrix forming the system. A potential barrier 14, due to the non implantation of inverse impurities in the substrate, forms a zone which isolates diode 11 from the reservoir capacities serving for charge transfer and the excess charges are removed by the diode 11 thus formed, and this permanently. If the length of the potential barrier is too small, the result is a lowering of the potential level which may lead to an injection of charges from diode 11 into the charge transfer device. The result of such saturation is that white columns are formed on the image obtained. Conversely, if the length of the potential barrier is too great, the storage capacity is reduced and thus even the dynamics of the device is thereby reduced.

The use of the new process of the invention for forming the matrix of the type shown in FIG. 7 guarantees the distance from diode 11 to the volume canal 15, but the area of the diode depends on the positioning of the photolithographic etching of the first silicon layer with respect to the thick oxide 13.

One way of overcoming this disadvantage is shown in FIG. 8. In the embodiment shown, the same diode may serve as anti-glare device for two pixels, a diode 11 disposed between two surface canal zones 14 and the thick oxide layer defines only two sides of the diode, the distance from the diode to the volume canal as well as the area of the diode being defined on the one hand by the photolithographic etching of the first silicon layer and on the other hand by the thick oxide layer 14.

What is claimed is:

1. A process for manufacturing an anti-blooming diode associated with a surface canal gate of a frame transfer matrix comprising the steps of depositing a first layer of a dielectric material on a silicon substrate then depositing a second polycrystalline silicon layer on this first layer, etching by a photolithographic process the second silicon layer so as to bare the dielectric layer in two zones, a first zone defining the space for formation of the diode, a second zone defining a volume canal zone, a third zone defining the surface canal being protected by the remaining silicon, implanting impurities in the volume transfer canal zone and masking the volume transfer canal zone while leaving the zone reserved for the diode uncovered so as to bare the substrate in the zone reserved for the diode and depositing a second polycrystalline silicon layer on the whole formed by the bared part of the substrate, the second silicon layer and the dielectric and etching the second of the two silicon layers so as to form the gate.

2. A process as claimed in claim 1, wherein each antiblooming diode of the frame transfer matrix is disposed between two surface canal zones and defined on two sides by the thick oxide layer of the frame transfer matrix, the distance from each diode to a volume canal of the charge transfer matrix being defined on the one hand by a photolithographic etching of the first silicon layer of the matrix and on the other hand by the thick oxide layer.

* * * * *